United States Patent
Bradley et al.

(10) Patent No.: US 12,031,880 B2
(45) Date of Patent: Jul. 9, 2024

(54) DUPLEX VISUAL TESTER FOR FIBER OPTICS

(71) Applicants: Brett Bradley, Yelm, WA (US); Nicholas Robert Spiker, Port Orchard, WA (US)

(72) Inventors: Brett Bradley, Yelm, WA (US); Nicholas Robert Spiker, Port Orchard, WA (US)

(*) Notice: Subject to any disclaimer, the term of this patent is extended or adjusted under 35 U.S.C. 154(b) by 291 days.

(21) Appl. No.: 17/735,032

(22) Filed: May 2, 2022

(65) Prior Publication Data
US 2023/0349789 A1 Nov. 2, 2023

(51) Int. Cl.
| | |
|---|---|
| H04B 3/46 | (2015.01) |
| G01M 11/00 | (2006.01) |
| G02B 6/38 | (2006.01) |
| H02J 7/00 | (2006.01) |
| H05K 5/02 | (2006.01) |
| H01M 10/0525 | (2010.01) |
| H01M 10/0565 | (2010.01) |
| H04B 10/079 | (2013.01) |

(52) U.S. Cl.
CPC .......... *G01M 11/39* (2013.01); *G02B 6/385* (2013.01); *H02J 7/0048* (2020.01); *H04B 3/46* (2013.01); *H05K 5/0247* (2013.01); *H05K 5/0252* (2013.01); *H01M 10/0525* (2013.01); *H01M 10/0565* (2013.01); *H04B 10/0795* (2013.01)

(58) Field of Classification Search
CPC .. G01M 11/39; G01M 11/33; G01M 11/3136; H04B 3/46
See application file for complete search history.

(56) References Cited

U.S. PATENT DOCUMENTS

| 10,656,343 B1* | 5/2020 | Applebaum | G02B 6/385 |
|---|---|---|---|
| 2016/0349145 A1* | 12/2016 | Irving | G01M 11/3154 |
| 2018/0340861 A1* | 11/2018 | Schell | G01M 11/333 |

FOREIGN PATENT DOCUMENTS

| CN | 103595469 A | * | 2/2014 | |
|---|---|---|---|---|
| WO | WO-2020070488 A1 | * | 4/2020 | G01M 11/31 |

* cited by examiner

*Primary Examiner* — Maurice C Smith
(74) *Attorney, Agent, or Firm* — John Alumit

(57) ABSTRACT

A duplex visual tester for testing multiple fiber optic cable runs includes a housing having a first LED and a second LED in a duplex fiber connection. The first LED and the second LED are in electronic communication with a power source, a battery, an on/off switch, and a timer configured to pulse the first LED and the second LED. The first LED and the second LED are installed in the duplex fiber connection. The first LED has a first color, and the second LED has a second, different color, wherein the first color and the second color have the same luminosity. Preferably, the timer pulses the first LED and the second LED at between eight and ten Hz, such that the first color and second color can be seen in the fiber optic cable run.

17 Claims, 2 Drawing Sheets

DUPLEX VISUAL TESTER FOR FIBER OPTICS

BACKGROUND

Field of the Disclosure

The present invention generally relates to fiber optics. More specifically, the present invention relates to a tool for diagnosing fiber optic connection issues

Related Art

Fiber optics, including fiber optic data cable, are typically cylindrical light-conducting waveguide that transmits light along its axis using total internal reflection. Light generally travels within an individual fiber optic cable without substantial light loss. In order to create a lengthy run of fiber optic cable, several individual cables may be used. The ends of individual cables are joined and aligned such that light traveling through one cable exits the end of the cable and enters an end of an adjacent cable.

To ensure maximum light transmission from cable to cable, fiber optic cables are cleaved to create as flat an end face as possible, perpendicular to the longitudinal axis of a fiber. A good cleave is required for an efficient cable splice, and when using an optical fiber connector. When using an optical fiber connector, it is frequently necessary to perform optic testing to diagnose any fiber optic connection issues. These may include: breaks, mismatched connections, or contaminants such as dirt in connections, which can lower luminosity. Currently known testing techniques include optical time domain reflectometry, using a fiber scope, employing an optical power meter and infrared (IR) light source, and using a visual fault locator.

An optical time domain reflectometer (OTDR) can diagnose fiber connection issues using a time delay analysis. By measuring the time delay of light travelling along the fiber, the testing equipment generates a representational reap of the fiber run, thereby allowing the system to measure reflection occurring at each connection point along the fiber run, or any reflection occurring along the fiber due to breaks or strains. OTDRs have a drawback in that they are expensive, costing between two and ten thousand dollars, and they require an end termination to properly map a fiber optic cable run. OTDRs are also bulky and require training and expertise to read the results. Additionally, multiple steps are required to diagnose polarity swaps.

A fiber scope is a microscope used for inspecting each fiber optic cable connection point. Fiber scopes are fairly affordable, generally costing between one hundred to a thousand dollars. Viewing a fiber optic cable connection with a fiber scope can tell a user if there is foreign material such as dirt in the connection, or scratches on the fiber end, which would impede light transfer. Fiber scopes are only useful at specific connection points, thus they cannot reveal issues regarding total system connectivity.

An optical power meter and IR light source are used in conjunction with one another. When the light source and power meter are connected to either end of a fiber run, they can determine how much light is passing through the cables, thereby indicating overall signal strength. Optical power meters and IR light sources are inexpensive, costing around fifty to two hundred dollars. The optical power meter/IR light source testing method is effective for troubleshooting, but still requires multiple steps to diagnose duplex fiber polarity swaps and signal strengths for both fibers in a duplex run.

A visual fault locator is a simple red laser diode, which is coupled to a fiber end such that a user can visually see any connection breaks or in-line breaks. It can also be used to diagnose polarity issues. There is no good reference for brightness when using a visual fault locator, ho since only one single fiber can be tested at a time due to only the red color being available.

Accordingly, there is a need for a fiber optic cable testing apparatus that provides fiber optic cable and connection testing without the limitations of existing techniques

SUMMARY

A duplex visual tester apparatus for testing multiple fiber optic cable runs includes a housing having a first LED and a second LED. The first LED and the second LED are in electronic communication with a power source, a battery, and a timer, with the timer configured to visually pulse the first LED and the second LED. A switch is provided and is configured to activate the first LED and the second LED when a first fiber optic cable is in visual communication with the first LED, and a second fiber optic cable is in visual communication with the second LED. The first LED has a first color, and the second LED has a second, different color for ease of visual detection. A duplex fiber connection configured to hold the first fiber optic cable proximal the first LED and hold the second fiber optic cable proximal the second LED.

In some implementations, the housing may be a rubber shell, and may include a clip loop extending from the housing for mounting the apparatus on a clip. In some implementations, the housing may surround a case. In such instances, the case encloses the first LED, the second LED, the power source, the battery, and the timer, among other features. The case preferably includes an indicator LED configured to indicate a power on state, a charging state, and a charged state, each with a different color. The case also preferably includes indicator labels for the power on state, the charging state, and the charged state. The case also includes a battery charge indicator configured to show a percentage of battery life. Preferably, the case is configured with the housing such that the apparatus is waterproof.

The apparatus may include a charging port for charging the battery. In one implementation, the charging port is a USB-C type charging port. The battery may be a lithium polymer (LiPo) battery. Preferably, the switch includes an on position wherein the first LED and the second LED are always on, and an auto position, wherein the first LED and the second LED are configured to be activated when a fiber optic cable is connected to either the first LED or the second LED. The timer is preferably configured to pulse the first LED and the second LED at between eight and ten Hz frequency. In order to support ease of visual detection, in one implementation the first LED is an amber LED with a light wavelength of 605 nanometers, while the second LED is a blue LED with a light wavelength of 515 nanometers. Preferably the first LED and the second LED have the same luminosity.

In another implementation, the apparatus may be characterized as a duplex visual tester for testing multiple fiber optic cable runs. The duplex visual tester includes a housing having a first LED and a second LED. The first LED and the second LED are adjacent to each other in a duplex fiber connection for the fiber optic cable run. The first LED and the second LED are in electronic communication with a power source, a battery, an on/off switch, and a timer configured to pulse the first LED and the second LED. The switch configured to automatically activate the first LED and the second LED when a first fiber optic cable is in visual communication with the first LED, and a second fiber optic cable is in visual communication with the second LED. The first LED and the second LED are installed in the duplex fiber connection. The first LED has a first color, and the second LED has a second, different color, wherein the first color and the second color have the same luminosity. Preferably, the timer pulses the first LED and the second LED at between eight and ten Hz, such that the first color and second color can be seen in the fiber optic cable run.

REFERENCE NUMBERS

Figure 1:
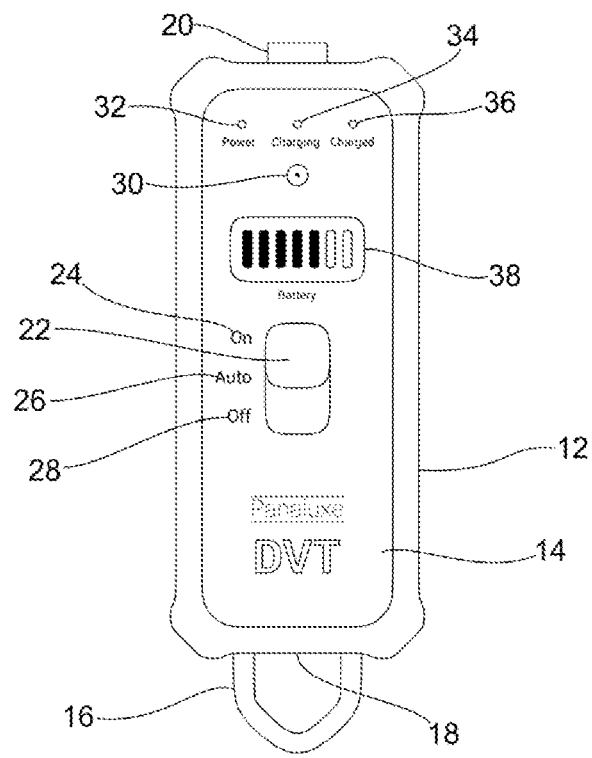
FIG. 1 illustrates a top plan view of a duplex visual tester in accordance with the present disclosure.

10. Duplex visual tester
12. Housing
14. Case
16. Clip loop
18. Charge port
20. Duplex fiber connection
22. Mode selector switch
24. On position
26. Auto position
28. Off position
30. Indicator LED
32. Blue indicator label
34. Red indicator label
36. Green indicator label
38. Battery level indicator
40. A side label
42. First LED
44. B side label
46. Second LED
48. LC duplex fiber barrel
50. First wavelength
52. Second wavelength
54. Fiber A side
56. Fiber B side
58. Resistor
60. Battery
62. Power switch
64. Timer
66. Charging Port

DESCRIPTION

The following description is presented to enable any person skilled in the art to make and use the invention and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown but is to be accorded the widest scope consistent with the principles and features disclosed herein.

Referring to FIG. 1, a duplex visual tester 10 comprises a housing 12. The housing 12 preferably comprises a resilient rubber or rubber-like shell to protect the duplex visual tester 10 when dropped, or otherwise encountering harsh conditions in the field. The housing surrounds a case 14 which encloses the components of the duplex visual tester 10. In one implementation the case comprises a substantially resilient plastic also for protection. Preferably, the housing 12 and case 14 are configured such that the duplex visual tester 10 is completely waterproof. The case 14 may include instructions for use (not shown) on the reverse of the duplex visual tester 10. A heavy-duty clip loop 16 preferably extends from the housing 12 to enable easy attachment to a belt or clip, such as a carabiner, during field use. The duplex visual tester 10 also preferably includes a charge port 18 for charging and battery powered operation. In one implementation, the charge port 18 may be a USB-C charge port.

Figure 2:
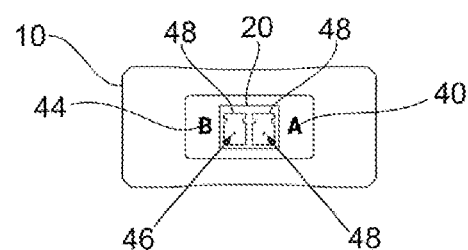
FIG. 2 illustrates a front elevation view of a duplex visual tester in accordance with the present disclosure

Still referring to FIG. 1, the duplex visual tester's 10 functional features include a LUCENT® connector (LC) duplex fiber connection 20 housing a first LED 22 (FIG. 2) and a second LED (FIG. 2). The LC duplex fiber connection 20 accepts the fiber optic cables (not shown) to be tested. The duplex visual tester 10 also includes a mode selector switch 22 for switching between on 24 off 26 and auto 28 positions. When the mode selector switch 22 is set to the on position, the duplex visual tester 10 emits light constantly from the duplex fiber connection 20. When the mode selector switch 22 is set to auto 28, the duplex visual tester only emits light when a fiber optic cable is connected to the duplex fiber connection 20. When the mode selector switch 22 is set to the off position, no light is emitted from the duplex fiber connection 20.

Still referring to FIG. 1, the duplex visual tester 10 includes an indicator LED 30, which is preferably an RGB (red, green, blue) LED capable of displaying different colors indicating different levels of power and charge of the duplex visual tester 10. A corresponding set of indicator labels are preferably provided to instruct the user as to the meaning of different indicator LED 30 colors when displayed. In one implementation, a blue indicator label 32 is provided for when the indicator LED 30 is blue indicating the duplex visual tester 10 is powered on. A red indicator label 34 is provided for when the indicator LED 30 is red indicating the duplex visual tester 10 is charging. A green indicator label 36 is provided for when the indicator LED 30 is green indicating the duplex visual tester 10 is charged. With regard to charge, the duplex visual tester 10 includes a battery level indicator for a user to determine when charging is needed. In one implementation, the battery level indicator 38 comprises an always-on e-paper display.

Referring to FIG. 2, the front of the duplex visual tester 10 is shown. The duplex fiber connection 20 preferably includes an air gap which greatly reduces contamination and connector damage. An A side label 40 is provided beside a first LED 42, and a B side label 44 is provided beside a second LED 46. In one implementation, the first LED 42 is an amber 605 nanometer three-watt LED, which is pulsed at eight Hz for easy visual identification, and the second LED 46 is a blue 515 nanometer three-watt LED, which is also pulsed at eight Hz for easy visual identification. Preferably the duplex fiber connection 20 includes a contact switch (not shown) for plug detection and may include LC duplex fiber barrels 48 for accommodating the terminal ends of a fiber optic cable.

Figure 3:
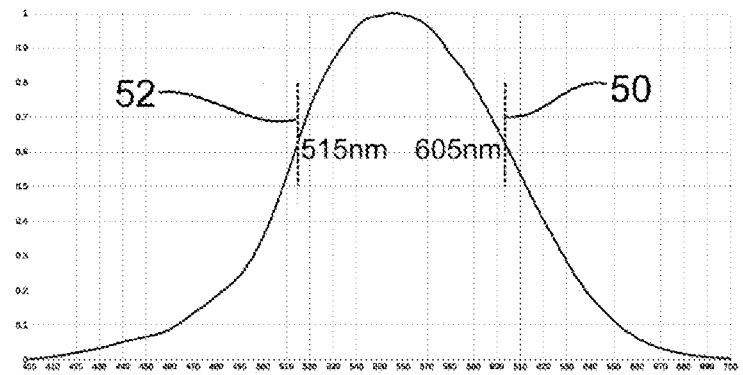
FIG. 3 illustrates a luminosity chart demonstrating the visual brightness versus wavelength of the duplex visual tester.

Referring to FIG. 3, the first LED 42 and the second LED 46 of the duplex visual tester 10 are high power LEDs, which are coupled with the duplex fiber optic cable ends. FIG. 3 is a graph representing the visual brightness or luminosity of the LEDs versus the first wavelength 50 (605 nm) of the first LED 42 color (amber) and the second wavelength 52 (515 nm) of the second LED 46 color (blue). The wavelengths of the two colors (amber/blue) were chosen to be easily visually distinguishable for polarity mismatches. Also, the colors are such that all users, including colorblind users can easily distinguish between each color. Additionally, the colors were selected so that the brightness levels are matched on both sides as illustrated by the graph.

Figure 4:
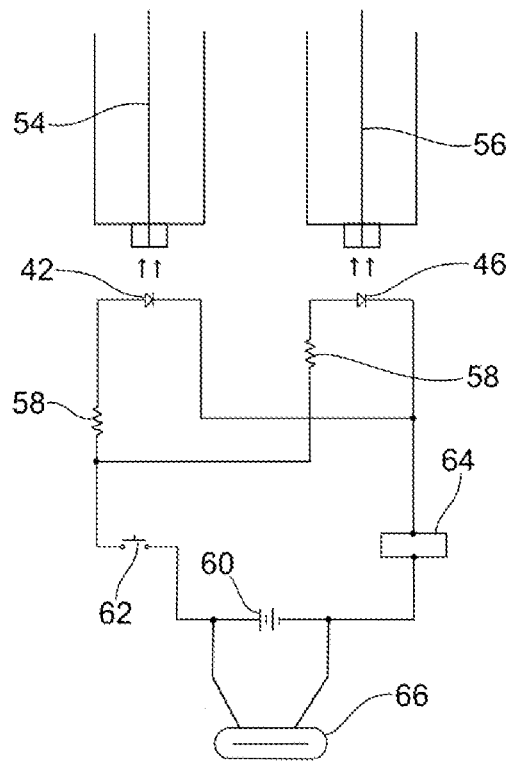
FIG. 4 illustrates a schematic circuit diagram of the duplex visual tester in accordance with the present disclosure.

Referring to FIG. 4, a circuit diagram of the duplex visual tester 10 is shown. A fiber A side 54 and a fiber B side 56 from a fiber optic run to be tested, approach the duplex visual tester 10. Fiber A side 54 approaches the first LED 42 which, in the exemplary implementation is a 605 nm amber LED. Fiber B side 56 approaches the second LED 46 which, in the exemplary implementation is a 515 nm blue LED. A pair of resistors 58 are provided between the first LED 42 and the second LED 46 and a power source battery 60 which in the illustrated implementation is preferably a lithium polymer (LiPo) battery 60. An i/o power switch 62 is provided for turning the duplex visual tester 10 on and off, and a timer 64 is provided. The timer is programmed to blink or pulse the first LED 42 and the second LED 44 for easy visual identification and to allow for quick troubleshooting without multiple pieces of equipment. In one implementation, the first LED 42 and the second LED 44 are pulsed at between eight and ten Hz per second. The duplex visual tester 10 also preferably includes a charging port 66 for charging the battery. In the illustrated implementation, the charging port 66 is a USB-C style charging port 66.

The duplex visual tester 10 allows a user to quickly troubleshoot polarity, as well as any light loss, without having tools on both ends of the fiber optic cable run. A user simply plugs the duplex visual tester 10 into one side of a fiber optic cable run and the user can quickly determine both polarity and connection issues by looking at the end connection.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A duplex visual tester apparatus for testing multiple fiber optic cable runs, the apparatus comprising:
   a housing having a first LED and a second LED;
   the first LED and the second LED in electronic communication with a power source, a battery, and a timer configured to pulse the first LED and the second LED;
   a switch configured to activate the first LED and the second LED when a first fiber optic cable is in visual communication with the first LED, and a second fiber optic cable is in visual communication with the second LED;
   the first LED having a first color and the second LED having a second, different color; and
   a duplex fiber connection configured to hold the first fiber optic cable proximal the first LED and hold the second fiber optic cable proximal the second LED.

2. The apparatus of claim 1 wherein the housing comprises a rubber shell.

3. The apparatus of claim 1 further comprising a clip loop extending from the housing opposite.

4. The apparatus of claim 1 wherein the housing surrounds a case, the case enclosing the first LED, the second LED, the power source, the battery, and the timer.

5. The apparatus of claim 4 wherein the case includes an indicator LED configured to indicate a power on state, a charging state, and a charged state, each with a different color.

6. The apparatus of claim 5 wherein the case includes indicator labels for the power on state, the charging state, and the charged state.

7. The apparatus of claim 4 wherein the case includes a battery charge indicator configured to show a percentage of battery life.

8. The apparatus of claim 4 wherein the case is configured with the housing such that the apparatus is waterproof.

9. The apparatus of claim 1 further comprising a charging port for charging the battery.

10. The apparatus of claim 9 wherein the charging port is a USB-C type charging port.

11. The apparatus of claim 1 wherein the battery is a lithium polymer (LiPo) battery.

12. The apparatus of claim 1 wherein the switch includes an on position wherein the first LED and the second LED are always on, and an auto position, wherein the first LED and the second LED are configured to be activated when a fiber optic cable is connected to either the first LED or the second LED.

13. The apparatus of claim 1 wherein the timer is configured to pulse the first LED and the second LED at between eight and ten Hz.

14. The apparatus of claim 1 wherein the first LED is an amber LED with a light wavelength of 605 nanometers.

15. The apparatus of claim 1 wherein the second LED is a blue LED with a light wavelength of 515 nanometers.

16. The apparatus of claim 1 wherein the first LED and the second LED each have the same luminosity.

17. A duplex visual tester apparatus for testing multiple fiber optic cable runs, the apparatus comprising:
   a housing having a first LED and a second LED, the first LED and the second LED adjacent each other in a duplex fiber connection for the fiber optic cable run;
   the first LED and the second LED in electronic communication with a power source, a battery, an on/off switch, and a timer configured to pulse the first LED and the second LED;
   the switch configured to automatically activate the first LED and the second LED when a first fiber optic cable is in visual communication with the first LED, and a second fiber optic cable is in visual communication with the second LED, and the first LED and the second LED are installed in the duplex fiber connection;
   the first LED having a first color and the second LED having a second, different color, wherein the first color and the second color have the same luminosity; and
   wherein the timer pulses the first LED and the second LED at between eight and ten Hz, such that the first color and second color can be seen in the fiber optic cable run.

* * * * *